(12) United States Patent
Thirunavukarasu et al.

(10) Patent No.: US 9,478,697 B2
(45) Date of Patent: Oct. 25, 2016

(54) REUSABLE SUBSTRATE CARRIER

(71) Applicant: APPLIED MATERIALS, INC., Santa Clara, CA (US)

(72) Inventors: Sriskantharajah Thirunavukarasu, Singapore (SG); Mingwei Zhu, Sunnyvale, CA (US); Karthik Elumalai, Bangalore (IN); Thean Ming Tan, Singapore (SG); Yong Cao, San Jose, CA (US); Daniel Lee Diehl, Chiba (JP); Nag Patibandla, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/538,766

(22) Filed: Nov. 11, 2014

(65) Prior Publication Data

US 2016/0133781 A1 May 12, 2016

(51) Int. Cl.
*A47G 29/08* (2006.01)
*H01L 33/00* (2010.01)

(52) U.S. Cl.
CPC ........ *H01L 33/0075* (2013.01); *H01L 33/0066* (2013.01); *H01L 33/0079* (2013.01)

(58) Field of Classification Search
CPC ........... H01L 33/0075; H01L 33/0066; H01L 33/079; H01L 21/67303; H01L 21/6732; H01L 21/67333; H01L 21/673; A47F 7/0042; A47F 7/0057; A47F 7/163
USPC ............... 211/41.18, 40, 41.12, 77, 69, 10; 414/935; D13/182; 206/307.1, 308.1, 206/309, 307, 712, 710, 725, 303; 220/507, 220/501, 553, 555
See application file for complete search history.

(56) References Cited

U.S. PATENT DOCUMENTS

| | | | | |
|---|---|---|---|---|
| 1,283,482 A * | 11/1918 | Durkee | ................. | A47F 7/0042 211/41.1 |
| 3,469,686 A * | 9/1969 | Gutsche | ............ | H01L 21/67346 206/518 |
| 3,719,273 A * | 3/1973 | Abe | ...................... | B65D 75/323 206/509 |
| 4,057,142 A * | 11/1977 | Lechner | ............. | B65D 77/0406 206/497 |
| D271,655 S * | 12/1983 | Numbers | ...................... | D7/707 |
| 4,775,055 A * | 10/1988 | Morse | ....................... | A47F 5/02 211/77 |
| 5,106,297 A * | 4/1992 | Discko, Jr. | ............ | A61C 19/005 206/564 |
| 5,577,621 A * | 11/1996 | Yi | ........................ | H01L 21/6732 211/41.18 |
| 5,670,268 A * | 9/1997 | Mancusi | ............. | H01M 2/1022 206/705 |
| 6,042,688 A * | 3/2000 | Masumura | .............. | B24B 37/28 156/345.14 |
| D457,434 S * | 5/2002 | Soh | ............................... | D9/456 |
| 6,439,984 B1 * | 8/2002 | Andres | ................... | B24B 37/28 264/130 |
| 6,450,346 B1 * | 9/2002 | Boyle | ............... | H01L 21/67303 118/500 |
| 6,491,179 B2 * | 12/2002 | Dokun | ............... | A47G 23/0641 220/507 |

(Continued)

*Primary Examiner* — Jennifer E Novosad
(74) *Attorney, Agent, or Firm* — Moser Taboada; Alan Taboada

(57) ABSTRACT

In some embodiments, a substrate carrier for holding a plurality of substrates comprises a disk formed of a continuous material to a nominal dimension which is approximately a multiple of a nominal dimension of a standard substrate size used in the manufacture of light emitting diode devices. In an embodiment, the disk is formed symmetrically about a central axis and defines a substantially planar upper surface. A first pair of pockets is defined in the upper surface of the disk, wherein the disk and each of the first pair of pockets are bisected by a first reference plane passing through the central axis. A second pair of pockets is defined in the upper surface of the disk, wherein the disk and each of the second pair of pockets are bisected by a second reference plane passing through the central axis.

15 Claims, 2 Drawing Sheets

(56) References Cited

U.S. PATENT DOCUMENTS

| | | | |
|---|---|---|---|
| 6,544,033 B1 | 4/2003 | Scudder et al. | |
| D674,759 S * | 1/2013 | Chang | D13/182 |
| D679,056 S * | 3/2013 | Mazza | D28/73 |
| 8,469,222 B1 * | 6/2013 | Stavitzski | B65D 85/36 206/563 |
| D686,175 S * | 7/2013 | Gurary | D13/182 |
| D690,671 S * | 10/2013 | Gurary | D13/182 |
| 8,544,390 B1 * | 10/2013 | Bahnsen | A47G 23/08 108/94 |
| D695,241 S * | 12/2013 | Gurary | D13/182 |
| D695,242 S * | 12/2013 | Gurary | D13/182 |
| 8,915,391 B2 * | 12/2014 | Radow | A47G 19/00 108/139 |
| D731,249 S * | 6/2015 | Keeth | D7/554.2 |
| 2001/0047978 A1 * | 12/2001 | Wenski | B24B 37/08 216/2 |
| 2006/0124480 A1 * | 6/2006 | Menard | B42F 15/0005 206/308.1 |
| 2007/0194027 A1 * | 8/2007 | Sarokin | B65D 77/0433 220/507 |
| 2007/0289973 A1 * | 12/2007 | Acosta | A47G 19/025 220/507 |
| 2010/0258475 A1 * | 10/2010 | Ogawa | H01L 21/67369 206/711 |
| 2013/0291492 A1 * | 11/2013 | Lewis | G11B 33/045 53/475 |
| 2014/0261698 A1 * | 9/2014 | Krishnan | C30B 25/12 137/1 |
| 2015/0211148 A1 * | 7/2015 | Krishnan | C23C 16/4584 118/728 |

* cited by examiner

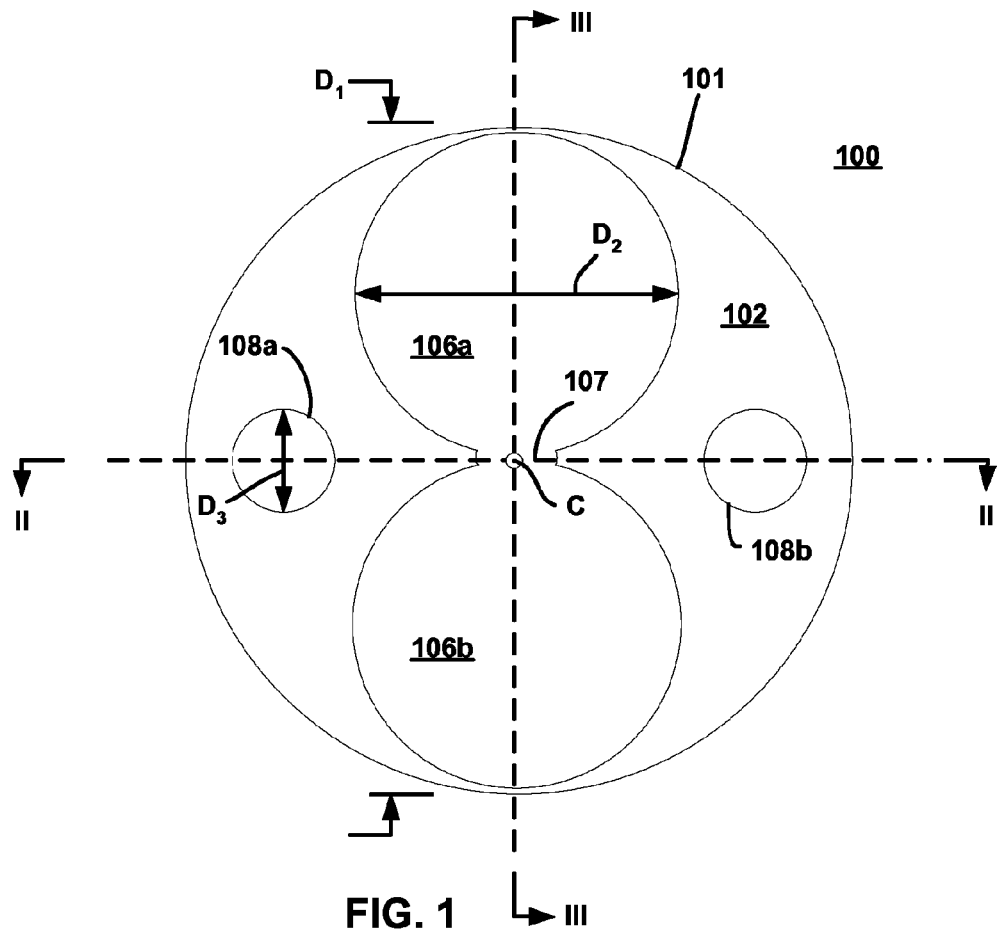
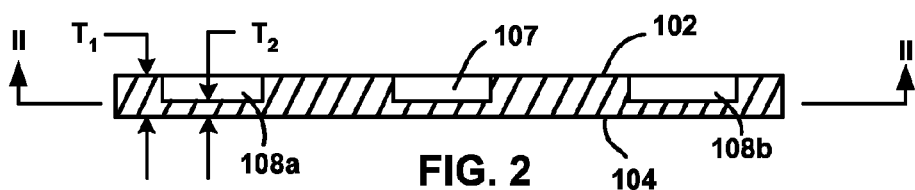
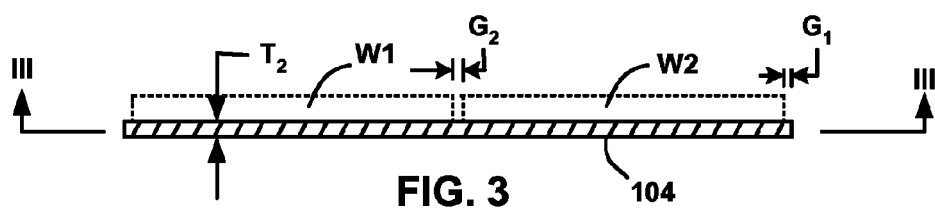

REUSABLE SUBSTRATE CARRIER

FIELD

Embodiments of the present disclosure relate generally to the field of semiconductor manufacturing and, more particularly, to handling of substrates in a substrate testing and/or processing procedure.

BACKGROUND

The fabrication of light-emitting diodes (LEDs) and other high-performance devices, such as laser diodes, optical detectors, and field effect transistors, typically utilizes a vacuum deposition process (e.g., physical vapor deposition (PVD), chemical vapor deposition (CVD), atomic layer deposition (ALD), etc.), to grow a thin film stack structure of group-ill nitride (or other materials) over a sapphire, silicon carbide, or silicon substrate. A thin-film vacuum deposition tool includes a process chamber, which is a sealed environment that allows infused gases to be deposited upon the substrate (typically in the form of wafers) to grow the thin film layers. An example of a current product line of such manufacturing equipment is the Impulse™ PVD AlN Chamber for deposition of a high quality aluminum nitride (AlN) buffer for gallium nitride LED, manufactured by Applied Materials Inc.

Substrate carriers support one or more substrates (such as wafers) and are used to transport and hold the one or more wafers inside furnaces, CVD and PVD process chambers, and/or other equipment. The carriers are frequently made of materials such as silicon carbide, silicon, or silicon carbide coated graphite, which allow them to be used at the elevated temperatures inside furnaces while the wafers are being processed. Depending on the materials that carriers are made of, the carriers can change size and/or deform (e.g., by "bowing") over time while exposed to elevated temperatures. This can pose a problem to substrate handling automation. Additionally, these carriers are also limited in their useful temperature range. In certain processes, some commonly used materials cannot be used because the carrier would deform to an unusable state rather quickly. If the carriers change dimensionally after a period of time due to the stresses of the fabrication processes, they could prove to be unusable in the substrate loading equipment.

Wafers having a diameter of 8 inches or more are commonly used in the semiconductor industry for the manufacture of integrated circuits. However, for such specialized devices as LEDs, sapphire wafers having a diameter smaller than 8 inches are often specified. Substrate carriers are typically configured to support a wafer or substrate of a given size, e.g., a given diameter. Thus, different substrate carriers are typically provided to support substrates of differing dimensions, which leads to increase in cost and complexity of substrate processing equipment.

Thus, the inventors have provided embodiments of improved substrate carriers that address one or more of the above disadvantages.

SUMMARY

Embodiments of substrate carriers which enable simultaneous processing of two or more substrates are provided herein. In some embodiments, substrate carrier includes: a disk formed of a continuous material to a nominal dimension which is approximately a multiple of a diameter of a standard substrate diameter used in the manufacture of light emitting diode devices. In some embodiments, the disk is formed symmetrically about a central axis and defines a substantially planar upper surface. A first pair of pockets is defined in the upper surface of the disk, wherein the disk and each of the first pair of pockets are bisected by a first reference plane passing through the central axis. A second pair of pockets is defined in the upper surface of the disk, wherein the disk and each of the second pair of pockets are bisected by a second reference plane passing through the central axis.

In another aspect, a substrate carrier for holding a plurality of substrates comprises a disk defining a top surface and a bottom surface separated by a thickness. A pair of pockets is formed through the top surface of the disk and each pocket extends through a portion of the thickness of the disk to define respective regions having a reduced thickness. The disk is formed about a central axis and the substrate carrier is a single continuous structure. In an embodiment, each of the pockets has a circular profile and a nominal diameter of approximately one half the overall diameter of the disk. The pockets are interconnected by a transition zone having the reduced thickness, the transition zone providing clearance to accommodate expansion of each substrate respectively placed in a corresponding pocket.

In a further aspect, there is provided a method of processing a substrate for a semiconductor device such as a light emitting diode. This method comprises placing one or more substrates in corresponding pockets defined in the upper surface of the substrate carrier and loading the wafer carrier in a process chamber for processing or testing. According to an embodiment, the method comprises providing a substrate carrier for holding a substrate, the substrate carrier comprising a disk having a top surface and a bottom surface separated by a thickness and a pair of pockets formed through a top surface of the disk and extending through a portion of the thickness of the disk to define respective regions of a reduced thickness, wherein the disk is formed about a central axis and the substrate carrier is a single continuous structure, and wherein each of the pockets has a nominal diameter of approximately one half a diameter of the disk and are interconnected by a transition zone having the reduced thickness and providing clearance to accommodate expansion of each substrate respectively placed in a corresponding pocket. The method further includes inserting a first substrate into a first pocket of the pair, inserting a second substrate into a second pocket of the pair; and placing the substrate carrier into a process chamber.

Other and further aspects, features, and advantages of illustrative embodiments will be apparent from the following description thereof given for the purpose of disclosure.

BRIEF DESCRIPTION OF THE DRAWINGS

Embodiments of the present disclosure, briefly summarized above and discussed in greater detail below, can be understood by reference to illustrative embodiments of the disclosure depicted in the appended drawings. It is to be noted, however, that the appended drawings illustrate only exemplary embodiments of the disclosure and are therefore not to be considered limiting of the scope of inventive principles set forth therein, for such principles may admit to other equally effective embodiments.

FIG. 1 is a top plan view depicting a substrate carrier constructed in accordance with some embodiments of the present disclosure;

FIG. 2 is a cross sectional view depicting the exemplary substrate carrier of FIG. 1, taken across the reference plane II-II shown therein;

FIG. 3 is a cross sectional view depicting the exemplary substrate carrier of FIG. 1, taken across the reference plane III-III shown therein.

Figure 4:
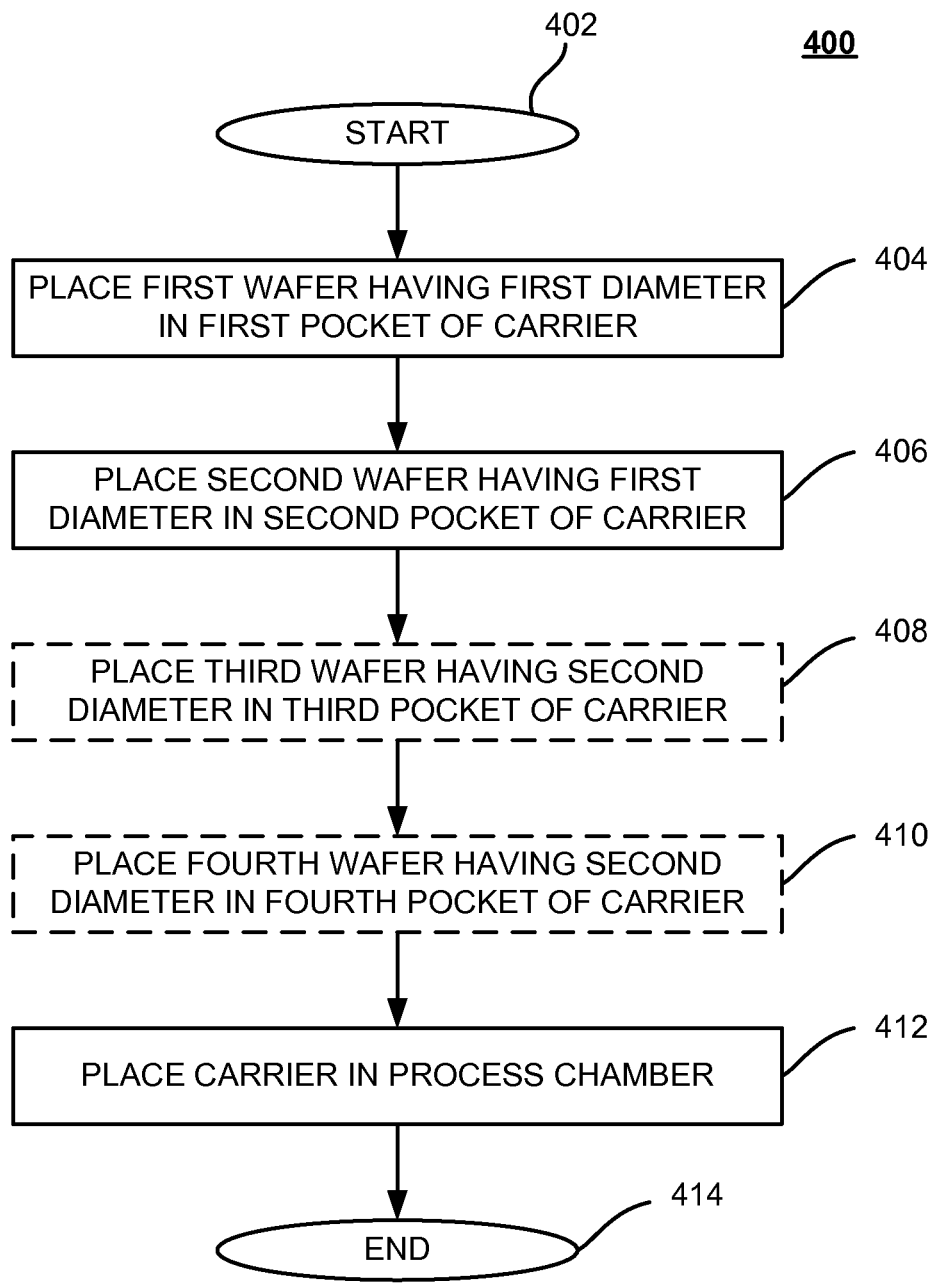
FIG. 4 depicts a flow chart of a process for using a substrate carrier in accordance with at least some embodiments of the present disclosure.

To facilitate understanding, identical reference numerals have been used, where possible, to designate identical elements that are common to the figures. The figures are not drawn to scale and may be simplified for clarity. It is contemplated that elements and features of one embodiment may be beneficially incorporated in other embodiments without further recitation.

DETAILED DESCRIPTION

Embodiments of substrate carriers which enable simultaneous processing of two or more substrates are provided herein. In some embodiments, a substrate carrier comprises a disk formed about a central axis and machined to approximately a multiple of the size of a substrate typically used in the fabrication of light emitting diode (LED) devices, and a plurality of wafer pockets symmetrically arranged relative the center axis for holding wafers or test chips for processing (FIG. 1). In some embodiments, the nominal substrate sizes, for which pockets are defined in an upper surface of the disk, are typically six inches, four inches, three inches, or two inches (for example, in the case of sapphire wafers used in the fabrication of LEDs). This design advantageously allows smaller wafers or test chips to run in a standard process chamber without having to reconfigure the process chamber size and perform robot calibrations, and without sacrificing processing results on the small wafers or test chips. The inventive substrate carrier also minimizes the need for time-consuming system size reconfigurations, and reduces risk of contamination by minimizing process chamber and robot exposure to the ambient environment.

Further provided herein is a method of processing one or more substrates using the substrate carrier described herein. According to some embodiments, at least some of the substrates for which a substrate carrier is designed to accommodate are wafers of a standard wafer size (e.g., having a nominal diameter of six inches, four inches, three inches, two inches, or the like). Thus, a substrate carrier having a nominal diameter of twelve inches (subject to tolerances for thermal expansion and contraction) would be approximately twice that of two six inch substrates positioned in respective pockets. Alternatively, however, a carrier disk having the same nominal diameter would be approximately three times that of a standard four inch diameter. In this case, the same disk nominal diameter is an approximate multiple of each of the aforementioned standard substrate sizes.

Other nominal substrate dimensions may in the future be accepted as standard for manufacturing process equipment compatibility purposes. Thus, a substrate carrier constructed according to some embodiments may be configured with a nominal dimension that is a multiple of one or more such later-accepted dimension(s). Moreover, though substrates of circular profile corresponding to wafers have been described and illustrated in connection with certain embodiments, the substrates may have other shapes as well (e.g., rectangular or other). Moreover, the actual profile shape of the multi-layered substrate need not conform to the profile of the substrates supported on the upper surface thereof.

In some embodiments, the substrates are wafers of a material commonly used in the fabrication of LED devices such as, for example, as a sapphire, silicon carbide, and/or Si. FIG. 1 depicts a top plan view of a substrate carrier 100 constructed in accordance with an illustrative embodiment. The substrate carrier 100 comprises a disk 101 formed of a continuous material to approximately a multiple of a diameter of a standard wafer size used in the manufacture of LED devices, the disk being formed symmetrically about a central axis C and defining a substantially planar upper surface 102. In some embodiments, the disk 101 further includes a substantially planar lower surface 104 opposite the upper surface 102. In some embodiments, the disk 101 is formed from monocrystalline silicon. In some embodiments, the disk 101 has a resistivity of at least 1.0 ohm-cm.

In some embodiments, the disk 101 has a diameter that is slightly greater than a multiple of a diameter of a standard wafer size used in the manufacture of LED devices. In the exemplary embodiment of FIG. 1, the substrate carrier has a nominal diameter which is slightly larger than approximately twice that of a standard wafer (for example, a six inch wafer).

A plurality of pockets are formed in the disk, for example. By machining and polishing the disk. A first pair of pockets 106a, 106b is defined in the upper surface 102 of the disk, and the disk and each of the first pair of pockets 106a and 106b is bisected by a first reference plane II-III passing through the central axis. In some embodiments, pockets 106a and 106b are disposed within a distance $G_1$ of an outer diameter of the disk 101. Pockets 106a and 106b are interconnected by a transition zone 107 which defines an expansion-accommodating gap $G_2$ between respective substrates W1 and W2 (FIG. 3) placed within the pockets.

In some embodiments, pockets 106a and 106b intersect with outer diameter of the disk 101. For example, each pocket 106a-b may be positioned such that an orientation flat of a wafer disposed in the respective pockets may be disposed adjacent the intersecting portion of the pocket and the disk to prevent the wafer from protruding beyond the diameter of the disk.

A second pair of pockets 108a and 108b is defined in the upper surface of the disk 101. The disk 101 and each of the second pair of pockets 108a and 108b are bisected by a second reference plane II-II passing through the central axis C. In some embodiments, the first and second reference planes are orthogonal to one another.

FIG. 2 is a cross sectional view depicting the exemplary substrate carrier of FIG. 1, taken across the reference plane II-II shown therein, while FIG. 3 is a cross sectional view depicting the exemplary substrate carrier of FIG. 1, taken across the reference plane III-III shown therein.

According to some embodiments, the first pair of pockets of substrate carrier 100 is configured to simultaneously receive two substrates, each having a circular periphery and a nominal diameter of 6 inches (150 mm). Maximum and minimum tolerances and dimensions for both the substrates and the corresponding pockets for the exemplary embodiment is shown in Table I below (in mm):

TABLE I

| Description | Nominal Diameter | Max Tolerance | Min Tolerance | Max Dimension | Min Dimension |
|---|---|---|---|---|---|
| Pocket Diameter | 150.8 | 0.1 | 0.1 | 150.9 | 150.7 |
| Wafer Diameter | 150 | 0.2 | 0.2 | 150.2 | 149.8 |
| Diametrical Clearance | 0.8 | | | 1.1 | 0.5 |

The inventors have determined that for a first pair pocket nominal diameter of 150.8, a pocket depth of from about 0.73 mm to about 0.88 mm, a thickness $T_1$ between the upper surface 102 and lower surface 104 of about 1.60 to about 1.70 mm, and a reduced thickness $T_2$ of about 0.82 to about 0.87 mm in the regions corresponding to the base of each pocket (and transition zone 107) results in a configuration which substantially avoids the development of stress cracking resulting from thermal expansion and contraction despite cycles of reuse.

The inclusion of the second pair of pockets, 108a and 108b, serves several purposes according to one or more embodiments. Second pair of pockets having diameters of two inches (50 mm) advantageously enable respective two inch nominal diameter sapphire wafers to be received and processed along with the larger six inch wafers. The inclusion of the second pair of pockets also advantageously enhances the distribution of thermal stresses, leading to a more stable carrier platform and one which enjoys a substantially longer service life—permitting many cycles of use, removal of deposited material and polishing, and subsequent use than would be the case in the absence of the second pair of pockets.

FIG. 4 depicts a flow chart of a process 400 for using a substrate carrier in accordance with embodiments of the present disclosure. Referring to FIG. 4, the process 400 is entered at 402 and advances to 404 where a first substrate such as a wafer (e.g., a sapphire wafer) having a first diameter of, for example, four or six inches is placed within a first pocket of a first pair of pockets defined in the upper surface of a carrier disk. The process proceeds to 406, where a second substrate having the first diameter is typically placed within a second pocket of the first pair of pockets defined in the upper surface of the carrier disk. The process proceeds to 408, where a third substrate having a second diameter smaller than the first diameter is optionally placed within a first pocket of a second pair of pockets and, then, to 410 where a fourth substrate having the second diameter is placed within a second pocket of the second pair of pockets. In some embodiments, the process 400 utilizes a disk fabricated and dimensioned and arranged as described with respect to FIGS. 1-3 above. The placement of the substrates can be done, for example, manually or robotically.

Once a pair of substrates are placed on the substrate carrier, and optionally after a second pair of substrates are also placed on the substrate carrier, the loaded substrate carrier may be placed in a process chamber for processing of the substrates. For example, the substrates may have processes performed on them such as, but not limited to, deposition, etching, treatment, cleaning, testing, or the like. For example, in embodiments where devices such as light emitting diodes are fabricated from the substrates placed within the pockets of the substrate carrier, one or more layers of at least one of aluminum nitride (AlN), gallium nitride (GaN), aluminum gallium nitride (AlGaN), indium nitride (InN), gallium indium nitride (GaInN), or aluminum gallium indium nitride (AlGaInN) are typically deposited on the substrates, as well as onto areas of the carrier itself.

To facilitate reuse, an etch stop may optionally be provided on surfaces of the substrate carrier to facilitate subsequent cleaning or removal of deposited materials from the substrate carrier using, for example, a conventional etchant. Alternatively, or in addition, some or all of the deposited material may be removed by mechanical operations (e.g., machining, grinding, and/or polishing). In some embodiments, the carriers are then checked to ensure conformance to applicable dimensional tolerances. Thereafter, subsequent substrates may be placed into some or all of the pockets defined in the upper surface of the substrate carrier for processing as described above.

The substrate carrier is compatible with the gas and temperature environment in a standard process chamber. This allows standard processing to be performed with the disk able to be handled and processed like a standard substrate. Thus, the substrate carrier can be reused repeatedly in a high temperature and corrosive environment.

Referring back to FIG. 2, as set forth in block 412, the unprocessed substrates carried by the loaded substrate carrier are transferred to a process chamber where one or more processes may be performed on the substrates disposed on the substrate carrier. For example, typical processes for forming LED devices upon sapphire wafers involve depositing by chemical vapor deposition and/or physical vapor deposition, one or more layers of a material such as aluminum nitride (AlN), gallium nitride (GaN), aluminum gallium nitride (AlGaN), indium nitride (InN), gallium indium nitride (GaInN), aluminum gallium indium nitride (AlGaInN), or the like. Similar or other processes may be performed on substrates of other dimensions and/or materials. According to some embodiments, and subsequent to use of a substrate carrier in one or more such deposition processes, the respective layers are removed, as by etching or machining and polishing, so that the carrier can be reused.

Various modifications and variations of the above-disclosed embodiments can be made without departing from the spirit or scope of the inventive principles embodied therein. Thus, while the foregoing is directed to embodiments of the present invention, other and further embodiments of the invention may be devised without departing from the basic scope thereof.

The invention claimed is:

1. A substrate carrier comprising:
    a disk formed of a continuous material, the disk being formed symmetrically about a central axis and defining a substantially planar upper surface;
    a first pair of pockets defined in the upper surface of the disk and each having a first diameter, wherein the disk and each of the first pair of pockets are bisected by a first reference plane passing through the central axis; and
    a second pair of pockets defined in the upper surface of the disk and each having a second diameter less than the first diameter,
    wherein the disk and each of the second pair of pockets are bisected by a second reference plane passing through the central axis, and
    wherein the pockets of the first pair are interconnected by a transition zone adapted to provide clearance to accommodate thermal expansion of each substrate respectively placed in a corresponding pocket of the first pair and subjected to at least one of a deposition, etching, treatment, cleaning or testing process in a process chamber.

2. The substrate carrier of claim 1, wherein the second reference plane is orthogonal to the first reference plane.

3. The substrate carrier of claim 2, wherein the pockets of the second pair are isolated from one another and from the pockets of the first pair.

4. The substrate carrier of claim 1, wherein the disk has a diameter of approximately a multiple of six inches, four inches, three inches or two inches.

5. The substrate carrier of claim 1, wherein the disk comprises monocrystalline silicon.

6. The substrate carrier of claim 5, wherein the disk has a resistivity of greater than 1.0 ohm-cm.

7. The substrate carrier of claim 1, wherein the disk further defines a substantially planar lower surface, wherein a thickness of the disk measured between the upper and lower surfaces is from 1.60 mm to 1.70 mm.

8. The substrate carrier of claim 7, wherein a thickness of the disk measured between a lower surface of each of the pockets and the planar lower surface is from about 0.82 to about 0.87 mm.

9. The substrate carrier of claim 1, wherein the disk has a nominal diameter of about 301 mm and wherein each of the first pair of pockets has a circular profile and a nominal diameter of about 150.8 mm.

10. The substrate carrier of claim 9, wherein each of the second pair of pockets has a circular profile and a nominal diameter of about 50.20 to about 50.30 mm.

11. A substrate carrier for holding a substrate, the substrate carrier comprising:
 a disk having an upper surface and a lower surface separated by a thickness; and
 a pair of pockets formed through the upper surface of the disk and extending through a portion of the thickness of the disk to define respective regions of a reduced thickness,
 wherein each pocket of the pair of pockets are bisected by a reference plane passing through a central axis of the disk;
 wherein each of the pockets has a nominal dimension of approximately a multiple of a nominal dimension of the disk; and
 wherein the pockets of the pair of pockets are interconnected by a transition zone having the reduced thickness, the reduced thickness of the transition zone being adapted to provide clearance to accommodate thermal expansion of each substrate respectively placed in a corresponding pocket and subjected to at least one of a deposition, etching, treatment, cleaning or testing process in a process chamber.

12. The substrate carrier of claim 11, wherein the disk comprises monocrystalline silicon.

13. The substrate carrier of claim 12, wherein the disk has a resistivity of greater than 1.0 ohm-cm.

14. The substrate carrier of claim 11, wherein the pair of pockets is a first pair of pockets bisected by a first reference plane passing through a central axis of the disk, and wherein a second pair of pockets is formed through a top surface of said disk, wherein the disk and each pocket of the second pair of pockets are bisected by a second reference plane passing through a central axis of the disk.

15. The substrate carrier of claim 11, wherein the transition zone passes through the central axis.

* * * * *